United States Patent
Bang et al.

(10) Patent No.: US 9,888,586 B2
(45) Date of Patent: Feb. 6, 2018

(54) ELECTRONIC DEVICE AND MANUFACTURING METHOD OF THE SAME

(71) Applicant: Samsung Electronics Co., Ltd, Gyeonggi-do (KR)

(72) Inventors: Jung-Je Bang, Gyeonggi-do (KR); Yong-Won Lee, Gyeonggi-do (KR); Jeong-Ung Kim, Gyeonggi-do (KR); Jae-Heung Ye, Gyeonggi-do (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/405,256

(22) Filed: Jan. 12, 2017

(65) Prior Publication Data

US 2017/0202093 A1    Jul. 13, 2017

(30) Foreign Application Priority Data

Jan. 12, 2016   (KR) .................. 10-2016-0003877

(51) Int. Cl.
  *H05K 9/00*   (2006.01)
  *H05K 5/00*   (2006.01)
  (Continued)

(52) U.S. Cl.
  CPC ............. *H05K 5/0004* (2013.01); *H01R 4/02* (2013.01); *H05K 1/18* (2013.01); *H05K 5/0086* (2013.01);
  (Continued)

(58) Field of Classification Search
  CPC ...... H05K 5/0004; H05K 1/18; H05K 5/0086; H05K 9/0007; H05K 9/0028; H01R 4/02
  (Continued)

(56) References Cited

U.S. PATENT DOCUMENTS 6,683,245 B1   1/2004   Ogawa et al.
6,670,559 B2   12/2004  Centola et al.
(Continued)

FOREIGN PATENT DOCUMENTS

JP   H0682894 A   3/1994
JP   08008571     1/1996
(Continued)

OTHER PUBLICATIONS

European Search Report dated Jun. 12, 2017 in connection European Patent Application No. 17 15 0113.
(Continued)

*Primary Examiner* — Sherman Ng

(57) ABSTRACT

According to embodiments, an electronic device includes: a housing including a face facing a first direction; a circuit board including first and second board faces substantially parallel to the face, and a side board face facing a second direction, the circuit board disposed within the housing; a first component disposed in a first region of the first board face; a second component disposed in a second region of the second board face overlapping with the first region; a first shield including a first side wall formed facing the second direction, the first shield covering the first region; a second shield including a second side wall formed facing the second direction, the second shield covering the second region; and a bonding material formed between the first side wall or second side wall and the side board face. The electronic device as described above may be variously implemented according to embodiments.

23 Claims, 12 Drawing Sheets

(51) Int. Cl.
*H01R 4/02* (2006.01)
*H05K 1/18* (2006.01)

(52) U.S. Cl.
CPC ......... *H05K 9/0007* (2013.01); *H05K 9/0028* (2013.01)

(58) Field of Classification Search
USPC .......................... 174/350, 377; 361/816, 818
See application file for complete search history.

(56) References Cited

U.S. PATENT DOCUMENTS

| | | | | |
|---|---|---|---|---|
| 9,521,741 | B1* | 12/2016 | Wang | H05K 1/0216 |
| 2008/0037238 | A1 | 2/2008 | Kimata et al. | |
| 2009/0057003 | A1 | 3/2009 | Crotty, Jr. | |
| 2010/0246143 | A1* | 9/2010 | Dinh | H05K 9/0026 361/748 |
| 2012/0080224 | A1* | 4/2012 | Yoo | H05K 1/0221 174/350 |
| 2012/0147573 | A1 | 6/2012 | Lim et al. | |
| 2015/0181773 | A1 | 6/2015 | Ueda et al. | |
| 2015/0264842 | A1* | 9/2015 | Song | H05K 9/0032 361/714 |

FOREIGN PATENT DOCUMENTS

| | | |
|---|---|---|
| JP | 2000196278 A | 7/2000 |
| KR | 20120065155 | 6/2012 |

OTHER PUBLICATIONS

Foreign Communication from a Related Counterpart Application, PCT Application No. PCT/KR2016/015460, International Search Report dated Mar. 17, 2017, 3 pages.
Foreign Communication from a Related Counterpart Application, PCT Application No. PCT/KR2016/015460, Written Opinion of the International Searching Authority dated Mar. 17, 2017, 6 pages.

* cited by examiner

ELECTRONIC DEVICE AND MANUFACTURING METHOD OF THE SAME

CROSS-REFERENCE TO RELATED APPLICATION(S) AND CLAIM OF PRIORITY

The present application is related to and claims the priority under 35 U.S.C. § 119(a) to Korean Application Serial No. 10-2016-0003877, which was filed in the Korean Intellectual Property Office on Jan. 12, 2016, the entire content of which is hereby incorporated by reference.

TECHNICAL FIELD

Various embodiments of the present disclosure relate to an electronic device. For example, various embodiments of the present disclosure relate to an electronic device that includes a shield structure, and a method of manufacturing the electronic device.

BACKGROUND

Typically, an electronic device refers to a device that performs a specific function according to an equipped program (e.g., an electronic scheduler, a portable multimedia reproducer, a mobile communication terminal, a tablet PC, an image/sound device, a desktop/laptop PC, or a vehicular navigation system), including a home appliance. For example, such an electronic device may output information stored therein as sound or an image. As the degree of integration of such an electronic device has increased, and as super-high speed and large capacity wireless communication has become popular, various functions have recently been equipped in a single mobile communication terminal. For example, various functions, such as an entertainment function (e.g., a game function), a multimedia function (e.g., a music/video reproducing function), a communication and security function for mobile banking, a schedule management function, and an e-wallet function, are integrated into a single electronic device, in addition to a communication function.

When the degree of integration of an electronic device increases, it may mean that electronic components mounted on a circuit board are miniaturized and the performances of the electronic components are improved. The electronic components may be manufactured in the form of an integrated circuit chip in which one circuit device (e.g., a processor, an audio module, a power management module, or a wireless frequency module) is incorporated, or in the form in which a plurality of circuit devices are integrated in a single integrated circuit chip.

SUMMARY

As the integration of degree of an electronic device increases, electromagnetic interference may occur between electronic components. For example, depending on the circuit device incorporated in an electronic component, electromagnetic waves may be generated when the electronic component is operated. The electromagnetic waves may degrade an operation performance of another electronic component.

In order to prevent the electromagnetic interference, various types of shield structures may be provided. For example, a conductive shield member may be provided to electrically isolate regions or spaces, which are provided with respective components, with respect to each other. However, it may become an impediment to the miniaturization in a printed circuit board because one or more holes or solder pads for mounting and fixing the conductive shield member should be disposed on at least one side of the printed circuit board, and it is necessary to secure a predetermined interval between one or more solder pads for mounting electronic components (e.g., an integrated circuit chip) on the surface of the printed circuit board and the solder pads for fixing the conductive shield member.

To address the above-discussed deficiencies, it is a primary object to provide a housing including a first face that faces a first direction; a printed circuit board including first and second board faces that are substantially parallel to the first face, and a side board face that faces a second direction that is different from the first direction, the printed circuit board being disposed within the housing; a first electronic component disposed in a first region of the first board face; a second electronic component disposed in a second region of the second board face that at least partially overlaps with the first region when viewed from above the first board face or the second board face; a first conductive shield member including a first side wall formed to face the second direction so as to extend at least a portion of the side board face, the first conductive shield member covering the first region; a second conductive shield member including a second side wall formed to face the second direction so as to extend at least a portion of the side board face, the second conductive shield member covering the second region; and at least one bonding material formed between the first side wall and at least a portion of the side board face and/or between the second side wall and at least a portion of the side board face. The second side wall and the first side wall may be engaged with each other in at least a portion of the side board face or adjacent to at least a portion of the side board face.

According to various embodiments of the present disclosure, a method of manufacturing an electronic device may include: an operation of providing a printed circuit board that includes a first board face, a second board face that is parallel to the first board face, and a side board face that interconnects the first and second board faces; an operation of forming a solder pad at least on the side board face; an operation of applying a first solder paste on a portion of the solder pad; performing a first reflow process to mount a first conductive shield member, which includes a first side wall extending to at least a portion of the side board face, on the printed circuit board to cover a first region using the first solder paste; an operation of applying a second solder paste on another portion of the solder pad; and performing a second reflow process to mount a second conductive shield member, which includes a second side wall extending to at least a portion of the side board face, on the printed circuit board to cover a second region by using the second solder paste.

Various embodiments of the present disclosure may provide an electronic device that includes a printed circuit board that is miniaturized while developing a stable operating environment of electronic components, and may also provide a method of manufacturing the electronic device.

Various embodiments of the present disclosure may provide an electronic device in which a shield structure (e.g., a conductive shield member) is stably fixed while a printed circuit board is miniaturized.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
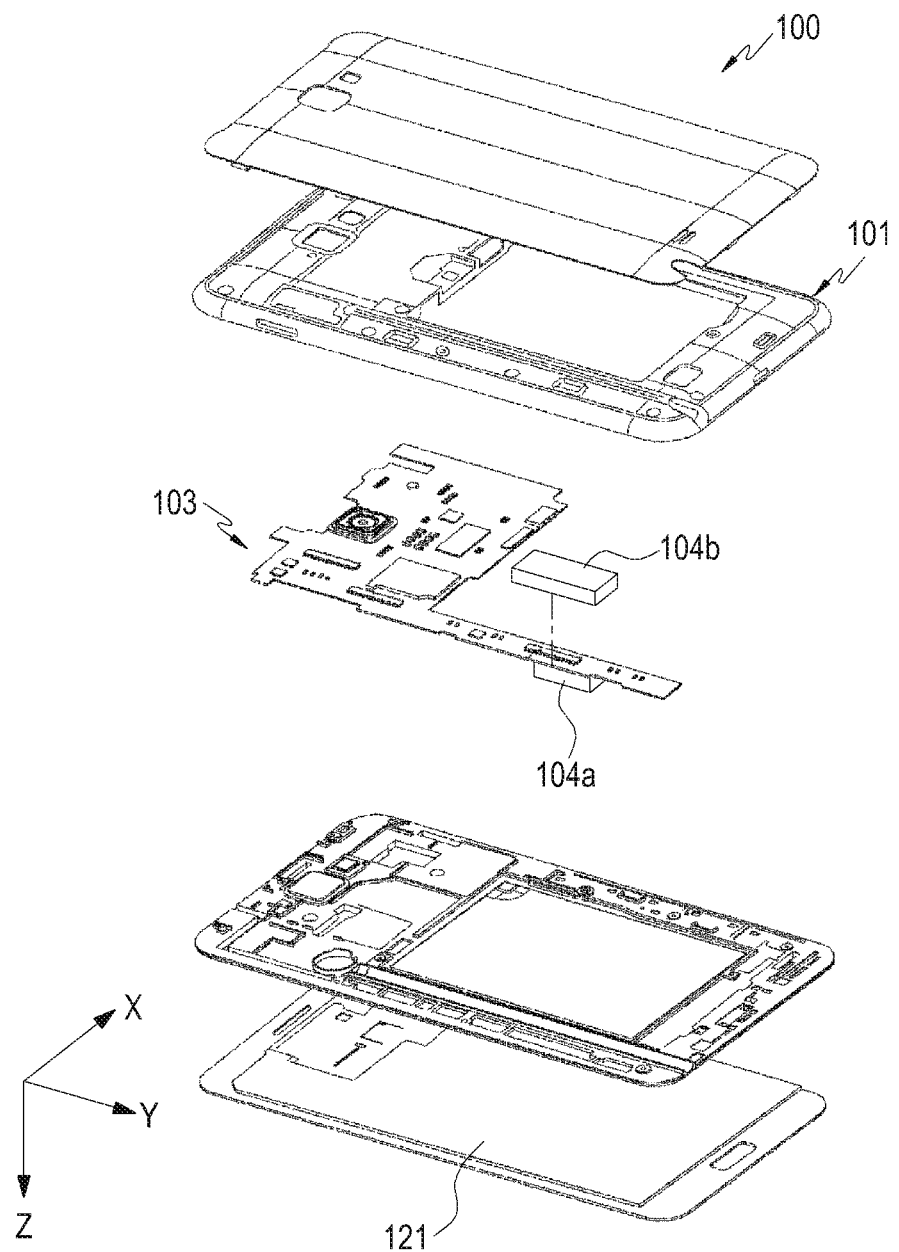
FIG. 1 illustrates an exploded perspective view of an electronic device according to various embodiments of the present disclosure.

FIGS. 1 through 17, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device.

Hereinafter, various embodiments of the present disclosure will be described with reference to the accompanying drawings. However, it should be understood that there is no intent to limit the present disclosure to the particular forms disclosed herein; rather, the present disclosure should be construed to cover various modifications, equivalents, and/or alternatives of embodiments of the present disclosure. In describing the drawings, similar reference numerals may be used to designate similar constituent elements.

In the present disclosure, the expression "have", "may have", "include" or "may include" refers to existence of a corresponding feature (e.g., numerical value, function, operation, or components such as elements), and does not exclude existence of additional features.

In the present disclosure, the expression "A or B," "at least one of A or/and B," or "one or more of A or/and B" may include all possible combinations of the items listed. For example, the expression "A or B," "at least one of A and B," or "at least one of A or B" refers to all of (1) including at least one A, (2) including at least one B, or (3) including all of at least one A and at least one B.

The expressions such as "first," "second," or the like used in various embodiments of the present disclosure may modify various elements regardless of order or importance, and do not limit corresponding elements. The above-described expressions may be used to distinguish an element from another element. For example, a first user device and a second user device indicate different user devices although both of them are user devices. For example, a first element may be termed a second element, and similarly, a second element may be termed a first element without departing from the scope of the present disclosure.

When it is mentioned that one element (e.g., a first element) is "(operatively or communicatively) coupled with/to or connected to" another element (e.g., a second element), it should be construed that the one element is directly connected to the another element or the one element is indirectly connected to the another element via yet another element (e.g., a third element). In contrast, it may be understood that when an element (e.g., first element) is referred to as being "directly connected," or "directly coupled" to another element (second element), there are no element (e.g., third element) interposed between them.

As used herein, the expression "configured to" may be interchangeably used with the expression "suitable for," "having the capability to," "designed to," "adapted to," "made to," or "capable of." The expression "configured to" may not necessarily mean "specially designed to" in terms of hardware. Alternatively, in some situations, the expression "device configured to" may mean that the device, together with other devices or components, "is able to." For example, the phrase "processor adapted (or configured) to perform A, B, and C" may mean a dedicated processor (e.g., embedded processor) only for performing the corresponding operations or a generic-purpose processor (e.g., central processing unit (CPU) or application processor (AP)) that can perform the corresponding operations by executing one or more software programs stored in a memory device.

The terms used herein are merely for the purpose of describing particular embodiments and are not intended to limit the scope of other embodiments. A singular expression may include a plural expression unless they are definitely different in a context. Unless defined otherwise, all terms used herein, including technical terms and scientific terms, may have the same meaning as commonly understood by a person of ordinary skill in the art to which the present disclosure pertains. Terms, such as those defined in commonly used dictionaries, should be interpreted as having a meaning that is the same or similar to their meaning in the context of the relevant art and will not be interpreted in an idealized or overly formal sense unless expressly so defined herein. In some cases, even the term defined in the present disclosure should not be interpreted to exclude embodiments of the present disclosure.

For example, the electronic device may include at least one of a smartphone, a tablet personal computer (PC), a mobile phone, a video phone, an electronic book (e-book) reader, a desktop PC, a laptop PC, a netbook computer, a personal digital assistant (PDA), a portable multimedia player (PMP), an MP3 player, a mobile medical appliance, a camera, and a wearable device (e.g., a head-mounted-device (HMD) such as electronic glasses, electronic clothes, an electronic bracelet, an electronic necklace, an electronic appcessory, electronic tattoos, or a smart watch).

In some embodiments, an electronic device may be a smart home appliance. The home appliance may include at least one of, for example, a television, a digital video disk (DVD) player, an audio, a refrigerator, an air conditioner, a vacuum cleaner, an oven, a microwave oven, a washing machine, an air cleaner, a set-top box, a home automation control panel, a security control panel, a TV box (e.g., SAMSUNG HOMESYNC™, APPLE TV™, or GOOGLE TV™), a game console (e.g., XBOX™ and PLAYSTATION™), an electronic dictionary, an electronic key, a camcorder, and an electronic photo frame.

According to another embodiment, the electronic device may include at least one of various medical devices (e.g., various portable medical measuring devices (a blood glucose monitoring device, a heart rate monitoring device, a blood pressure measuring device, a body temperature measuring device, etc.), a Magnetic Resonance Angiography (MRA), a Magnetic Resonance Imaging (MRI), a Computed Tomography (CT) machine, and an ultrasonic machine), a navigation device, a Global Positioning System (GPS) receiver, an Event Data Recorder (EDR), a Flight Data Recorder (FDR), a Vehicle Infotainment Devices, an electronic devices for a ship (e.g., a navigation device for a ship, and a gyro-compass), avionics, security devices, an automotive head unit, a robot for home or industry, an automatic teller's machine (ATM) in banks, point of sales (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, etc.).

According to some embodiments, the electronic device may include at least one of a part of furniture or a building/structure, an electronic board, an electronic signature receiving device, a projector, and various kinds of measuring instruments (e.g., a water meter, an electric meter, a gas meter, and a radio wave meter). In various embodiments, the electronic device may be a combination of one or more of the aforementioned various devices. According to some embodiments, the electronic device may also be a flexible device. Further, the electronic device according to an embodiment of the present disclosure is not limited to the aforementioned devices, and may include a new electronic device according to the development of technology.

FIG. 1 is a perspective illustrating an electronic device 100 according to various embodiments of the present disclosure in a disassembled state.

Referring to FIG. 1, the electronic device 100 according to various embodiments of the present disclosure may include a housing 101, a printed circuit board 103, a plurality of electronic components 131 and 133, and a first conductive shield member 104a and/or a second conductive shield member 104b. The first conductive shield member 104a and/or the second conductive shield member 104b may be mounted on, and fixed to, a side face of the printed circuit board 103 (e.g., a side board face F3 of FIG. 5 to be described) via a bonding material (e.g., a bonding material 705 of FIG. 7 to be described). For example, a portion (e.g., a side wall) of the first conductive shield member 104a and a portion (e.g., a side wall) of the second conductive shield member 104b may be matingly engaged with each other in the side board face of the printed circuit board 103, or in the vicinity of the side board face of the printed circuit board 103. In one embodiment, the first conductive shield member 104a and/or the second conductive shield member 104b may be mounted on the printed circuit board 103 through a surface mounting process, and the bonding material may be formed of a solder paste and/or solder coated, for example, at least on the side board face of the printed circuit board 103.

According to various embodiments of the present disclosure, the housing 101 may include a first facing that faces a first direction Z (e.g., the front side). In one embodiment, a first plate (e.g., a window member 102) may be mounted and arranged on the first face of the housing 101. The window member 102 may be made of a transparent glass material, and a display 121 may be mounted on an inner face of the window member 102. A battery recess 111, a camera opening 113, or the like may be disposed on a face that is opposite to the first face (e.g., the rear face of the housing 101). In one embodiment, a cover member 119 may be removably provided on the rear face of the housing 101. In another embodiment, the cover member 119 may be integrally formed on the rear face of the housing 101.

According to various embodiments of the present disclosure, the printed circuit board 103 is mounted to be accommodated within the housing 101, and a plurality of electronic components 131 and 133 may be disposed on the printed circuit board 103. It is noted that while the present embodiment exemplifies a configuration in which one printed circuit board 103 is accommodated in the housing 101, the present disclosure is not limited by the configuration. For example, a plurality of boards may be accommodated in the housing 101, and may be variously designed in terms of the number, the sizes, and shapes of the boards in consideration of the internal structure or the like of the housing 101. In one embodiment, the electronic components 131 and 133 may be disposed on a first board face and a second board face (e.g., a first board face F1 and a second board face F2 of FIGS. 3 and 4 to be described later) of the printed circuit board 103, respectively.

According to various embodiments of the present disclosure, the first conductive shield member 104a may be mounted on the first board face and the second conductive shield member 104b may be mounted on the second board face of the printed circuit board 103 such that each of the regions or spaces where the electronic components 131 and 133 may be isolated from another space. For example, the first conductive shield member 104a or the second conductive shield member 104b may be mounted on the printed circuit board 103 in a state of enclosing at least one of the electronic components 131 and 133. A mounting structure of the first conductive shield member 104a or the second conductive shield member 104b will be described in more detail through the embodiments illustrated in FIG. 3 or the like.

Figure 2:
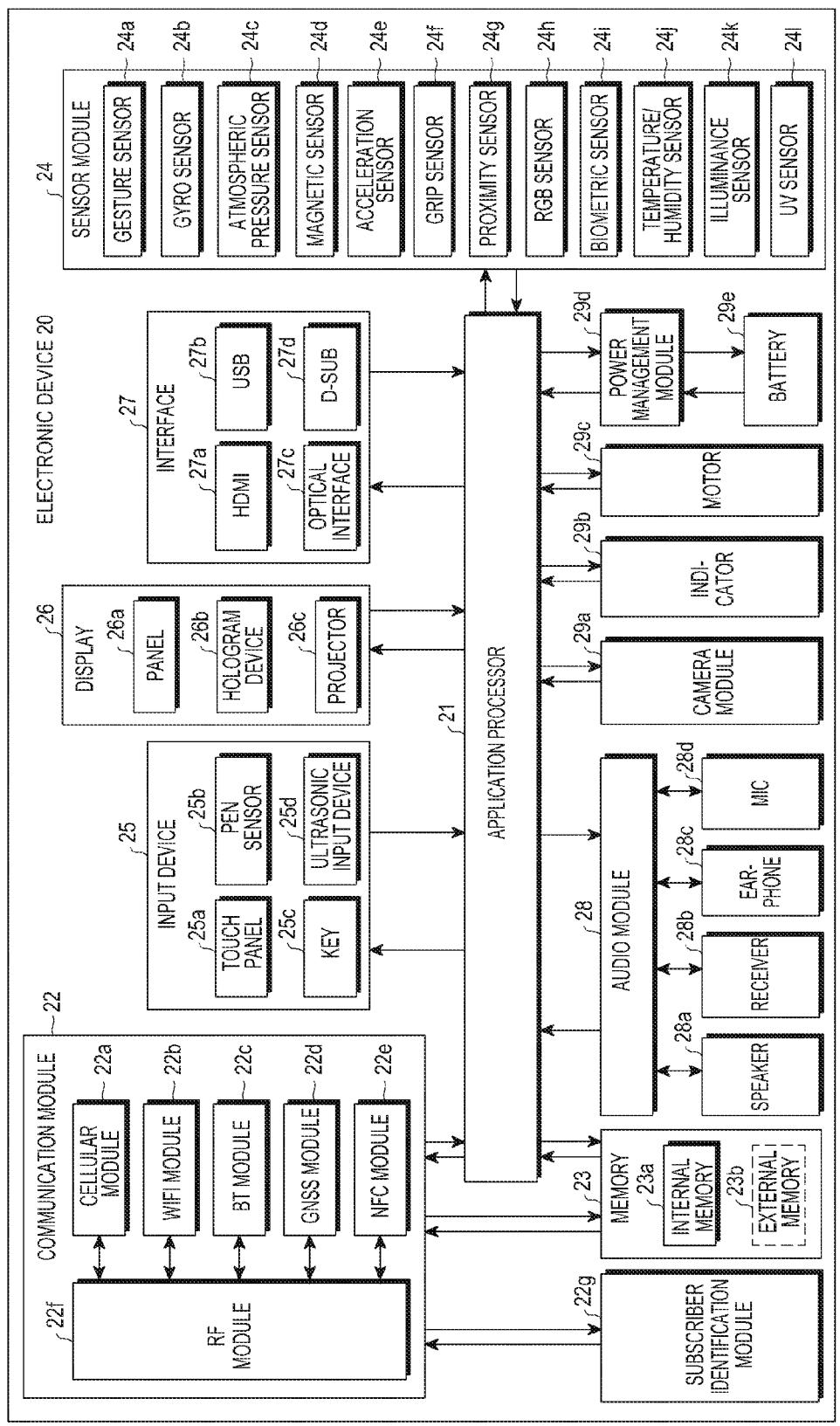
FIG. 2 illustrates a block diagram of an electronic device according to various embodiments of the present disclosure.

FIG. 2 is a block diagram illustrating an electronic device 20 according to various embodiments of the present disclosure.

Referring to FIG. 2, the electronic device 20 may include, for example, the whole or a portion of the electronic device 100 illustrated in FIG. 1. The electronic device 20 may include at least one Application Processor (AP) 21, a communication module 22, a subscriber identification module (e.g., an SIM card) 22g, a memory 23, a sensor module 24, an input device 25, a display 26, an interface 27, an audio module 28, a camera module 29a, an indicator 29b, a motor 29c, a power management module 29d, and a battery 29e. According to one embodiment, the electronic components 131 and 132 of FIG. 1 may be an integrated circuit chip that is equipped with at least one of circuit devices (e.g., the AP 21, the communication module 22, the memory 23, the sensor module 24, the audio module 28, and the power management module 29d). In another embodiment, the electronic components 131 and 133 of FIG. 1 may be an integrated circuit chip that is equipped with another circuit device that is not recited above.

The AP 21 may drive, for example, an operating system or an application program so as to control a plurality of hardware or software components connected thereto, and may also perform various data processing and arithmetic operations. The AP 21 may be implemented by, for example, a System-on-Chip (SoC). According to one embodiment, the AP 21 may further include a Graphic Processing Unit (GPU) and/or an image signal processor. The AP 21 may include at least some components (e.g., the cellular module 22a) among the components illustrated in FIG. 2. The AP 21 may load a command or data received from at least one of the other components (e.g., a non-volatile memory) in a volatile memory to process the command and data, and may store various data in a non-volatile memory.

The communication module 22 may include, for example, a cellular module 22a, a WiFi module 22b, a BT module 22c, a GNSS module 22d, an NFC module 22e, and a Radio Frequency (RF) module 22f.

The cellular module 22a may provide, for example, a voice call, a video call, a message service, or an internet service through, for example, a communication network. According to one embodiment, the cellular module 22a may perform discrimination and authentication of the electronic device 20 within the communication network by using the subscriber identification module (e.g., an SIM card) 22g. According to certain embodiments, the cellular module 22a may perform at least some of the functions that may be provided by the AP 21. According to certain embodiments, the cellular module 22a may include a communication processor (CP).

Each of the wireless fidelity (Wi-Fi) module 22b, the BLUETOOTH (BT) module 22c, the global navigation satellite system (GNSS) module 22d, and the near field communication (NFC) module 22e may include, for example, a processor to process data transmitted or received through a corresponding module. According to certain embodiments, at least some (e.g., two or more) of the cellular module 22a, the Wi-Fi module 22b, the BT module 22c, the GNSS module 22d, and the NFC module 22e may be incorporated in a single integrated chip (IC) or an IC package.

The radio frequency (RF) module 22f may transmit or receive, for example, a communication signal (e.g., an RF signal). The RF module 22f may include, for example, a transceiver, a power amp module (PAM), a frequency filter, a low noise amplifier (LNA), or an antenna. According to certain embodiments, at least one of the cellular module 22a, the Wi-Fi module 22b, the BT module 22c, the GNSS module 22d, and the NFC module 22e may transmit or receive an RF signal through one or more separate RF modules.

The subscriber identification module (e.g., an SIM card) 22g may include, for example, a card that includes subscriber information and/or an embedded SIM, and may also include intrinsic identification information (e.g., integrated circuit card identifier (ICCID)) or subscriber information (e.g., international mobile subscriber identity (IMSI)).

The memory 23 may include, for example, an internal memory 23a or an external memory 23b. The internal memory 23a may include at least one of, for example, a volatile memory (e.g., a dynamic RAM (DRAM), a static RAM (SRAM), or a synchronous DRAM (SDRAM)) and a non-volatile memory (e.g., a one time programmable ROM (OTPROM), a programmable ROM (PROM), an erasable and programmable ROM (EPROM), an electrically erasable and programmable ROM (EEPROM), a mask ROM, a flash ROM, a flash memory (e.g., a NAND flash memory or a NOR flash memory), a hard drive, or a solid state drive (SSD)).

The external memory 23b may further include a flash drive (e.g., a compact flash (CF), a secure digital (SD), a micro secure digital (Micro-SD), a mini secure digital (Mini-SD), an extreme digital (xD), a multi-media card (MMC), or a memory stick). The external memory 23b may be functionally or physically connected to the electronic device 20 through various interfaces.

For example, the sensor module 24 may measure a physical quantity or may sense an operating status of the electronic device 20, and may then convert the measured or sensed information into electric signals. The sensor module 24 may include at least one of, for example, a gesture sensor 24a, a gyro sensor 24b, an atmospheric pressure sensor 24c, a magnetic sensor 24d, an acceleration sensor 24e, a grip sensor 24f, a proximity sensor 24g, an RGB (red, green, blue) sensor 24h, a biometric sensor 24i, a temperature/humidity sensor 24j, an illuminance sensor 24k, and an ultra-violet (UV) sensor 24l. Additionally or alternatively, the sensor module 24 may include, for example, an E-nose sensor, an electromyography (EMG) sensor (not illustrated), an electroencephalogram (EEG) sensor, an electrocardiogram (ECG) sensor, an infra-red (IR) sensor, an iris sensor, or a fingerprint sensor. The sensor module 24 may further include a control circuit for controlling one or more sensors incorporated therein. In a certain embodiment, the electronic device 20 may further include a processor configured to control the sensor module 24 as a part of the AP 21 or separate from the AP 21 so as to control the sensor module 24 while the AP 21 is in the sleep state.

The input device 25 may include, for example, a touch panel 25a, a (digital) pen sensor 25b, a key 25c, or an ultrasonic input device 25d. As the touch panel 25a, at least one of, for example, a capacitive type touch panel, a resistive type touch panel, an infrared type touch panel, and an ultrasonic type panel may be used. In addition, the touch panel 25a may further include a control circuit. The touch panel 25a may further include a tactile layer so as to provide a tactile reaction to a user.

The (digital) pen sensor 25b may be, for example, a portion of the touch panel, or may include a separate recognition sheet. The key 25c may include, for example, a physical button, an optical key, or a keypad. The ultrasonic input device 25d is capable of confirming data by sensing sound waves with a mic (e.g., the microphone 28d) in the electronic device 20 through an input tool that generates an ultrasonic signal.

The display 26 may include a panel 26a, a hologram device 26b, or a projector 26c. The panel 26a may be provided as the display 121 of FIG. 1, and may be implemented to be flexible, transparent, or wearable. The panel 26a may be configured as a single module with the touch panel 25a. The hologram device 26b may show a stereoscopic image in the air using interference of light. The projector 26c may project light onto a screen so as to display an image. The screen may be located, for example, inside or outside the electronic device 20. According to certain embodiments, the display 26 may further include a control circuit configured to control the panel 26a, the hologram device 26b, or the projector 26c.

The interface 27 may include, for example, a high-definition multimedia interface (HDMI) 27a, a universal serial bus (USB) 27b, an optical interface 27c, or a d-sub-miniature (D-sub) 27d. The interface 27 may include, for example, a mobile high-definition link (MHL) interface, a secure digital (SD) card/multi-media card (MMC) interface, or an infrared data association (IrDA) standard interface.

The audio module 28 may bi-directionally convert, for example, sound and electric signals. The audio module 28 may process sound information input or output through, for example, a speaker 28a, a receiver 28b, an earphone 28c, or a microphone 28d.

The camera module 29a is a device that is capable of photographing, for example, a still image and a moving image, and according to certain embodiments, may include one or more image sensors (e.g., a front sensor or a rear sensor), a lens, an image signal processor (ISP), or a flash (e.g., an LED or xenon lamp).

The power management module 29d may manage, for example, the electric power of the electronic device 20. According to certain embodiments, the power management module 29d may include a power management integrated circuit (PMIC), a charging integrated circuit (IC), or a battery or fuel gauge. The PMIC may be configured as a wired and/or wireless charging type. The wireless charging type may include, for example, a magnetic resonance type, a magnetic induction type, or an electromagnetic wave type, and may further include an additional circuit for wireless charging (e.g., a coil loop, a resonance circuit, or a rectifier). The battery gauge may measure, for example, the residual capacity of the battery 29e, and a voltage, a current, or a temperature during the charging. The battery 29e may include, for example, a rechargeable battery and/or a solar battery.

The indicator 29b may indicate a specific status of the electronic device 20 or of a part thereof (e.g., the AP 21) (e.g., a booting status, a message status, or a charged status). The motor 29c may convert an electric signal into a mechanical vibration, and may generate a vibration, a haptic effect, or the like. Although not illustrated, the electronic device 20 may include a processor (e.g., a GPU) to support a mobile TV. The processor to support a mobile TV may process media data according to the standards of, for example, digital multimedia broadcasting (DMB), digital video broadcasting (DVB), or media flow.

Each of the components of the electronic device according to the present disclosure may be implemented by one or more components and the name of the corresponding component may vary depending on a type of the electronic device. In various embodiments, the inspection apparatus may include at least one of the above-described elements. Some of the above-described elements may be omitted from the electronic device, or the inspection apparatus may further include additional elements. Further, some of the components of the electronic device according to the various embodiments of the present disclosure may be combined to form a single entity, and thus, may equivalently execute functions of the corresponding elements prior to the combination.

The term "module" as used herein may, for example, mean a unit including one of hardware, software, and firmware or a combination of two or more of them. The "module" may be interchangeably used with, for example, the term "unit", "logic", "logical block", "component", or "circuit". The "module" may be a minimum unit of an integrated component element or a part thereof. The "module" may be a minimum unit for performing one or more functions or a part thereof. The "module" may be mechanically or electronically implemented. For example, the "module" according to the present disclosure may include at least one of an application-specific integrated circuit (ASIC) chip, a field-programmable gate arrays (FPGA), and a programmable-logic device for performing operations which has been known or are to be developed hereinafter.

According to various embodiments, at least some of the devices (for example, modules or functions thereof) or the method (for example, operations) according to the present disclosure may be implemented by a command stored in a computer-readable storage medium in a programming module form. When the command is executed by one or more processors (for example, the processor 21), the one or more processors may execute a function corresponding to the command. The computer-readable storage medium may, for example, be the memory 23. At least some of the programming modules may be implemented (for example, executed) by, for example, the processor. At least some of the programming modules may include, for example, a module, a program, a routine, a set of instructions or a process for performing one or more functions.

The computer readable recoding medium includes magnetic media such include magnetic media, such as a hard disk, a floppy disk and a magnetic tape, optical media, such as a Compact Disc Read Only memory (CD-ROM) and a digital versatile disc (DVD), magneto-optical media, such as a floptical disk, and a hardware device specially configured to store and execute a program command, such as a read only memory (ROM), a random access memory (RAM) and a flash memory. In addition, the program instructions may include high class language codes, which can be executed in a computer by using an interpreter, as well as machine codes made by a compiler. The aforementioned hardware device may be configured to operate as one or more software modules in order to perform the operation of the present disclosure, and vice versa.

The programming module according to the present disclosure may include one or more of the aforementioned components or may further include other additional components, or some of the aforementioned components may be omitted. Operations executed by a module, a programming module, or other component elements according to various embodiments of the present disclosure may be executed sequentially, in parallel, repeatedly, or in a heuristic manner. Furthermore, some operations may be executed in a different order or may be omitted, or other operations may be added.

Meanwhile, the exemplary embodiments disclosed in the specification and drawings are merely presented to easily describe the technical contents of the present disclosure and help with the understanding of the present disclosure and are not intended to limit the scope of the present disclosure. Therefore, all changes or modifications derived from the technical idea of the present disclosure as well as the embodiments described herein should be interpreted to belong to the scope of the present disclosure.

Figure 3:
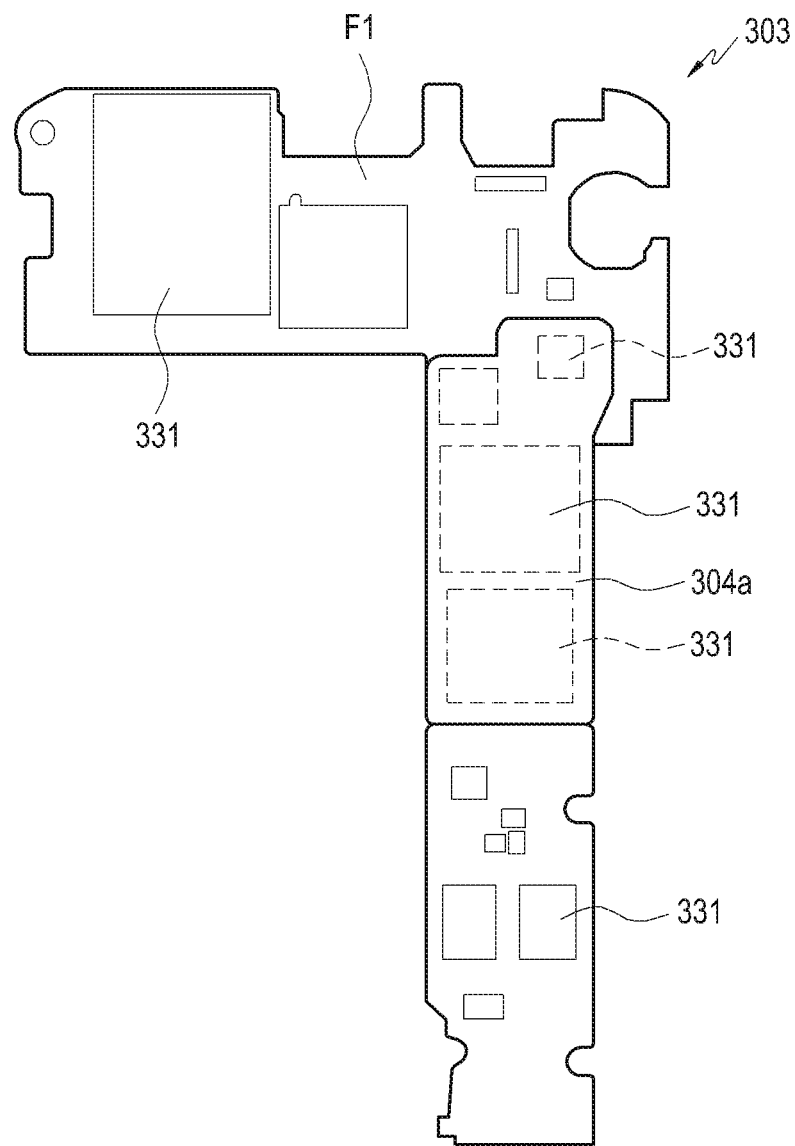
FIG. 3 illustrates a plan view of a first board face of a shield structure of the electronic device according to various embodiments of the present disclosure.
Figure 4:
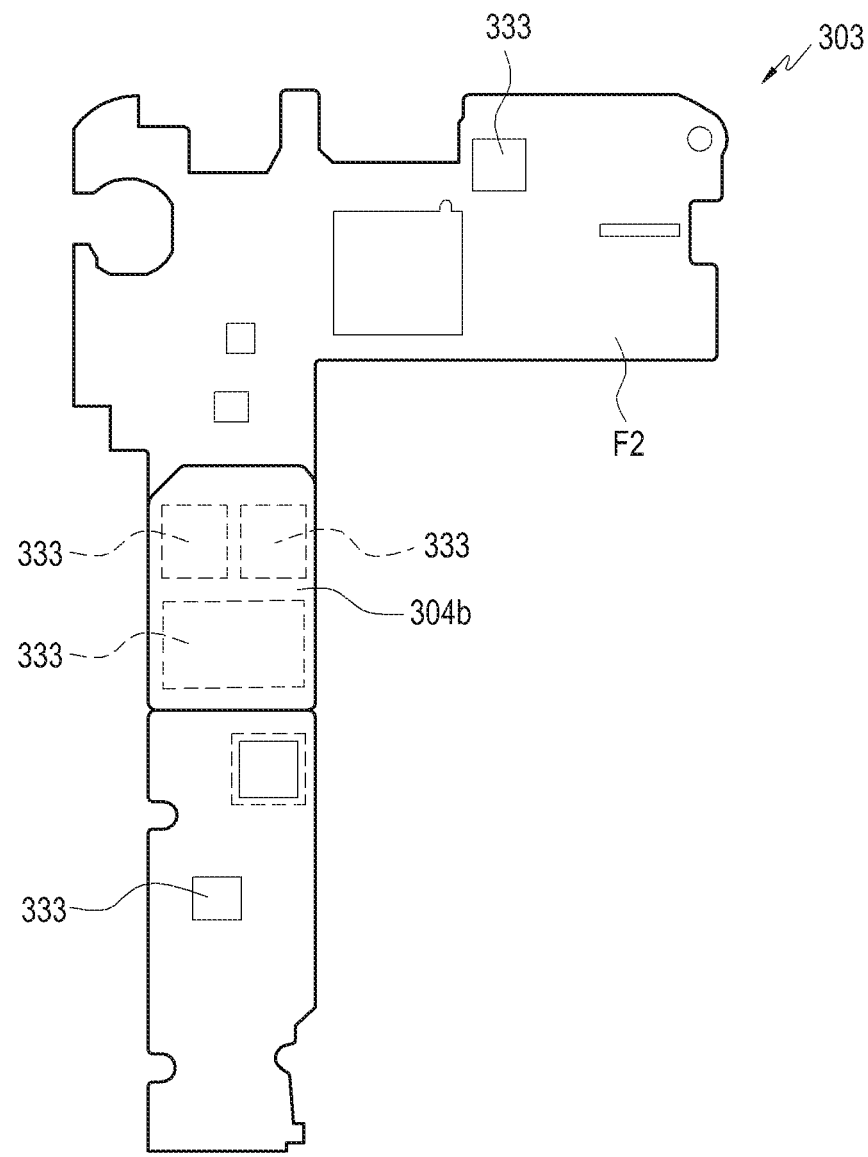
FIG. 4 illustrates a plan view of a second board face of a shield structure of the electronic device according to various embodiments of the present disclosure.
Figure 5:
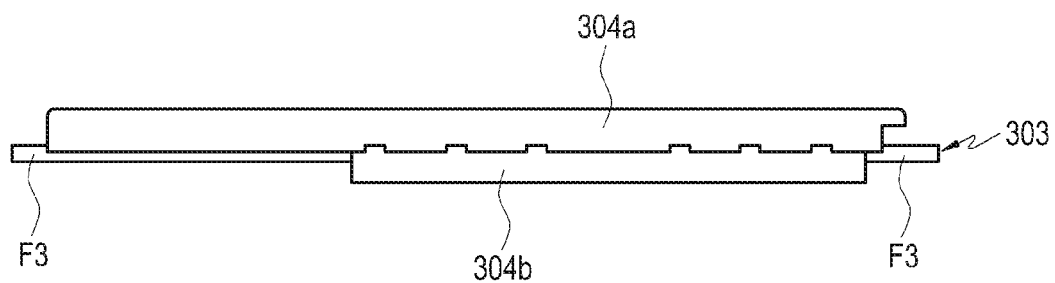
FIG. 5 illustrates a side view of a shield structure of the electronic device according to various embodiments of the present disclosure.

FIG. 3 illustrates a plan view of a first board face F1, of a shield structure of the electronic device according to various embodiments of the present disclosure. FIG. 4 illustrates a plan view of a second board face F2, of a shield structure of the electronic device according to various embodiments of the present disclosure. FIG. 5 illustrates a side view of a shield structure of the electronic device according to various embodiments of the present disclosure.

Referring to FIGS. 3, 4 and 5, a shield structure of an electronic device according to various embodiments of the present disclosure (e.g., the electronic device 100 of FIG. 1) may include at least one of conductive shield members 304a and 304b (e.g., the first conductive shield member 104a and the second conductive shield member 104b of FIG. 1) that spatially and/or electrically isolate at least some of the electronic component 331 and 333 mounted on the printed circuit board 303 with respect other electronic components.

According to various embodiments of the present disclosure, a printed circuit board 303 may include a first board face F1, a second board face F2, and/or a side board face F3. In certain embodiments, the first board face F1 may be substantially parallel to the first face of the housing (e.g., the housing 101 of FIG. 1), and the second board face F2 may be substantially parallel to the first board face F1. The second board face F2 may be connected to the first board face F1 via the side board face F3. For example, the first board face F1 may be disposed to face the front side of the above-described electronic device (e.g., the electronic device 100 of FIG. 1), and the second board face F2 may be disposed to face the rear side. The side board face F3 may be disposed to face a second direction (e.g., the X-direction of FIG. 1) that is different from the first direction (Z) (e.g., to face a side face of the above-described electronic device).

According to various embodiments of the present disclosure, the electronic components 331 and 333 may be, for example, an integrated circuit chip(s) that is equipped with at least one of various circuit devices described above with reference to FIG. 2. Among the electronic components 331 and 333, the first electronic components 331 may be mounted on the first board face F1. Some of the first electronic components 331 may be disposed to be adjacent to each other within a predetermined region (hereinafter, a "first region") in the first board face F1. According to certain embodiments, the first conductive shield member 304a may be disposed to cover the first region so as to block an electromagnetic interference phenomenon between the first electronic components 331. According to various embodiments, when a plurality of first electronic components 331 are disposed to be adjacent to each other in the first region, the first conductive shield member 304a may include a partition formed therein so as to prevent the electromagnetic interference between the first electronic components 331 disposed in the first region.

Among the electronic components 331 and 333 according to various embodiments of the present disclosure, the second electronic components 333 may be mounted on the second board face F2. Some of the second electronic components 333 may be disposed to be adjacent to each other within a predetermined region (hereinafter, a "second region") in the second board face F2. The second region may at least partially overlap with the first region when viewed from above the first board face F1 or the second board face F2. According to certain embodiments, the second conductive shield member 304b may be disposed to cover the second region so as to block an electromagnetic interference phenomenon between the second electronic components 333. According to various embodiments, when a plurality of second electronic components 333 are disposed to be adjacent to each other in the second region, the second conductive shield member 304b may include a partition formed therein so as to prevent the electromagnetic interference between the second electronic components 333 disposed in the second region.

According to certain embodiments, a portion of each of the first conductive shield member 304a and the second conductive shield member 304b extends to at least a portion of the side board face F3 such that the first conductive shield member 304a and the second conductive shield member 304b are matingly engaged with each other in the side board face F3 or in the vicinity of the side board face F3. On the side board face F3, a portion of the first conductive shield member 304a and the second conductive shield member 304b may be alternately arranged along the longitudinal direction of the side board face F3. For example, a portion of the first conductive shield member 304a and a portion of the second conductive shield member 304b may be alternately engaged so as to form a line in a zigzag form.

Figure 6:
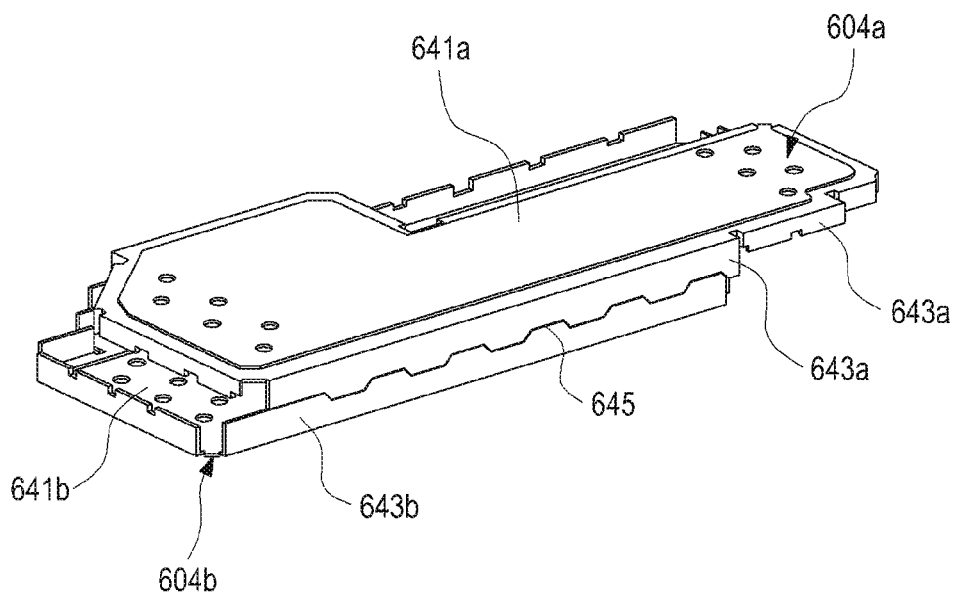
FIG. 6 illustrates a perspective view of a shield structure of an electronic device according to various embodiments of the present disclosure.

FIG. 6 illustrates a perspective view of a shield structure of an electronic device according to various embodiments of the present disclosure.

FIG. 6 illustrates conductive shield members 604a and 604b mounted on a printed circuit board in a state of accommodating at least one electronic component in which it is noted that the printed circuit board or the like is omitted in order to clearly show the configurations of the conductive shield members 604a and 604b more clearly.

Referring to FIG. 6, the shield structure of the electronic device (e.g., the electronic device 100 of FIG. 1) according to various embodiments of the present disclosure may include a first conductive shield structure 604a (e.g., the first conductive shield member 304a of FIGS. 3 to 5) disposed to cover a first region on the first board face of the printed circuit board (e.g., the printed circuit board 303 of FIGS. 3 to 5) and a second conductive shield member 604b (e.g., the second conductive shield member 304b of FIGS. 3 to 5) disposed to cover a second region on the second board face of the printed circuit board. As described with reference to FIGS. 3 to 5, the second region may at least partially overlap with the first region when viewed from above the first board face F1 or the second board face F2. In certain embodiments, the first conductive shield member 604a and the second conductive shield member 604b may be mounted to partially face each other across the printed circuit board.

According to various embodiments of the present disclosure, the first conductive shield member 604a may include a first flat plate 641a facing the first board face of the printed circuit board (e.g., the above-mentioned first region) and side walls extending from the first flat plate 641a. The side walls may include a first side wall 643a extending to at least a portion of the side board face (e.g., the side board face F3 of FIG. 5) of the printed circuit board from the edge of the first flat plate 641a. For example, the first side wall 643a may be formed to face the same direction as the side board face F3 (e.g., the X-direction of FIG. 1). According to certain embodiments, when the first conductive shield member 604a is mounted on the first board face F1, the first flat plate 641a and the first side wall 643a may form a space that accommodates and isolates some of the above-described first electronic components (e.g., the first electronic component 331 of FIG. 3), together with the first region.

According to various embodiments of the present disclosure, the second conductive shield member 604*b* may include a second flat plate 641*b* facing the second board face of the printed circuit board (e.g., the above-mentioned second region) and side walls extending from the second flat plate 641*b*. The side walls may include a second side wall 643*b* extending to at least a portion of the side board face (e.g., the side board face F3 of FIG. 5) of the printed circuit board from the edge of the second flat plate 641*b*. For example, the second side wall 643*b* may be formed to face the same direction as the side board face F3 (e.g., the X-direction of FIG. 1). For example, when the second conductive shield member 604*a* is mounted on the second board face F2, the second flat plate 641*b* and the second side wall 643*b* may form a space that accommodates and isolates some of the above-described second electronic components (e.g., the second electronic component 333 of FIG. 3), together with the second region.

According to various embodiments, in the side board face F3 and/or in the vicinity of the side board face F3, the second side wall 643*b* and the first side wall 643*a* may be matingly engaged with each other to form a zigzag line 645. For example, the first side wall may include an edge having first repeated patterns, and the second side wall may include an edge having second repeated patterns that are engaged with the first repeated patterns. In certain embodiments, the zigzag line 645 may be positioned within the thickness range of the side board face F3. In certain embodiments, the zigzag line 645 may be partially positioned out of the thickness range of the side board face F3.

According to various embodiments of the present disclosure, when the first conductive shield member 604*a* and the second conductive shield member 604*b* are mounted on the printed circuit board, the first side wall 643*a* and the second side wall 643*b* may be disposed in a state where the faces thereof facing the side board face F3 are positioned in a substantially common plane. Here, from the "substantially common surface," it means that the inner faces of the first side wall 643*a* and the second side wall 643*b* may be arranged to be parallel to each other and/or to be inclined to each other within a range of design allowance values in the state where the first side wall 643*a* and the second side wall 643*b* are mounted on the printed circuit board.

Figure 7:
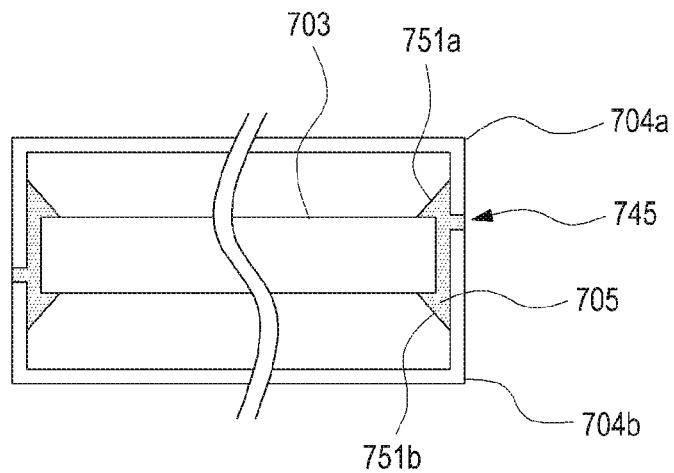
FIG. 7 illustrates a sectional view of a shield structure of an electronic device according to various embodiments of the present disclosure.

FIG. 7 illustrates a sectional view of a shield structure of an electronic device according to various embodiments of the present disclosure.

Referring to FIG. 7, the shield structure of the electronic device according to various embodiments (e.g., the electronic device 100 of FIG. 1) may include a first conductive shield member 704*a* mounted on the top surface of the printed circuit board 703, a second conductive shield member 704*b* mounted on the bottom surface of the printed circuit board 703, and a bonding material 705. The bonding material 705 may include, for example, a fillet formed in a reflow operation during a soldering or surface mounting process, and may fixedly mount the first conductive shield member 704*a* and the second conductive shield member 704*b* on the printed circuit board 703. The bonding material 705 may include inclined faces 751*a* and 751*b* that extend to the inner face of the first conductive shield member 704*a* and the inner face of the second conductive shield member 704*b*, respectively, on any one side of the printed circuit board 703. According to various embodiments, the bonding material 705 may be formed between at least a portion of first side wall of the first conductive shield member 704*a* (e.g., the first side wall 643*a* of FIG. 6) and at least a portion of a side board face of the printed circuit board 703 and/or between at least a portion of a side wall of the second conductive shield member 704*b* (e.g., the second side wall 643*b* of FIG. 6) and at least a portion of the side board face of the printed circuit board 703 (e.g., the side board face F3 of FIG. 5).

In certain embodiments, the bonding material 705 may be exposed to the outside of the first conductive shield member 704*a* or the outside of the second conductive shield member 704*b*. For example, the bonding material 705 may be partially exposed to the outside through a gap 745 between the side wall of the first conductive shield member 704*a* and the side wall of the second conductive shield member 704*b* (e.g., the portion indicated by reference numeral "745"). According to various embodiments, the above-described zigzag line (e.g., the zigzag line 645 of FIG. 6) may be sealed by the bonding material 705 so as to strengthen the shield performance by the first conductive shield member 704*a* and/or the second conductive shield member 704*b*.

In certain embodiments, the above-described electronic device (e.g., the electronic device 100 of FIG. 1) may further include a solder pad that enhances bonding affinity between the printed circuit board 703 and the bonding material 705. The solder pad may provide a print region of a solder paste that forms the bonding material 705, or may limit a region in which the solder paste melt during a reflow operation may be spread on the printed circuit board 703. The configuration of the solder pad will be described in more detail with reference to, for example, FIG. 10.

Figure 8:
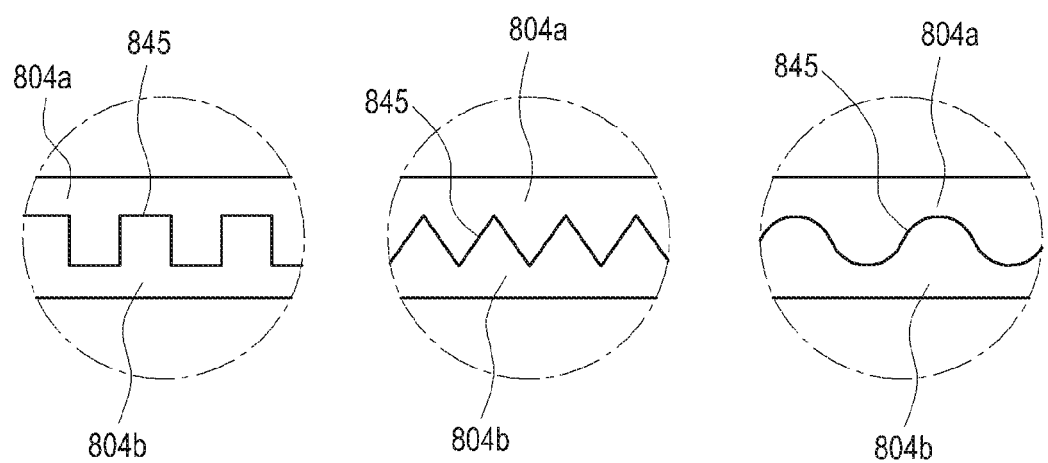
FIG. 8 illustrates a view for describing various modifications of a shield structure of an electronic device according to various embodiments of the present disclosure.

FIG. 8 illustrates a view for describing various modifications of a shield structure of an electronic device according to various embodiments of the present disclosure.

Referring to FIG. 8, in a shield structure of an electronic device according to various embodiments of the present disclosure (e.g., the electronic device 100 of FIG. 1), a zigzag line 845, which is formed as a portion of a first conductive shield member 804*a* (e.g., the first side wall 641*a* of FIG. 6) and a portion of a second conductive shield member 804*b* (e.g., the second side wall 641*b* of FIG. 6) are matingly engaged with each other, may have various forms. For example, the zigzag line 845 may be formed to have various shapes (e.g., a shape based on a rectangular shape, a shape based on a triangular shape, and a shape based on a circular arc shape). In certain embodiments, the bonding material 705 may bond each of a portion of the first conductive shield member 804*a* (e.g., the first side wall 641*a* of FIG. 6) and a portion of the second conductive shield member 804*b* (e.g., the second side wall 641*b* of FIG. 6) to the side board face of the printed circuit board and may be formed to seal at least the zigzag line 845, thereby further strengthening the performance of the shield structure.

Figure 9:
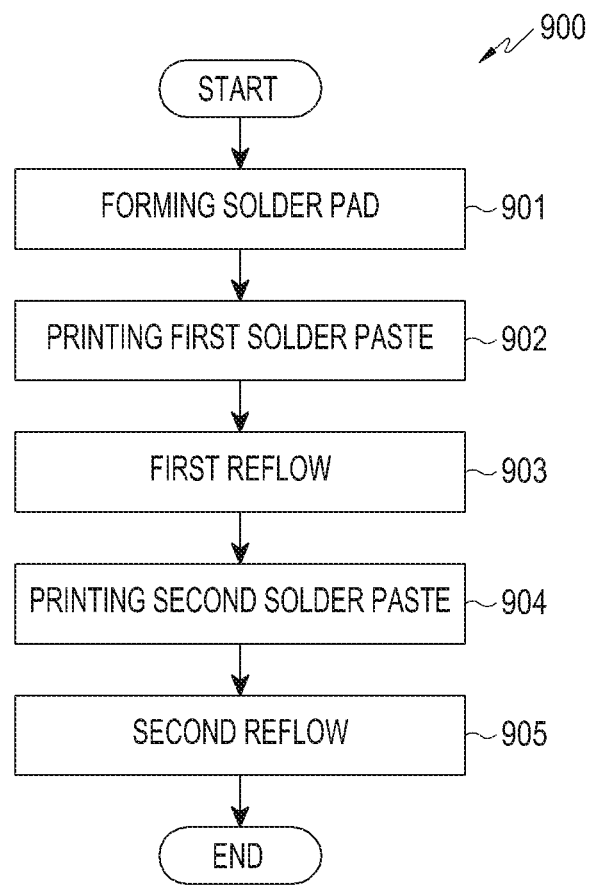
FIG. 9 illustrates a flowchart for describing a method of manufacturing an electronic device according to various embodiments of the present disclosure.
Figure 10:
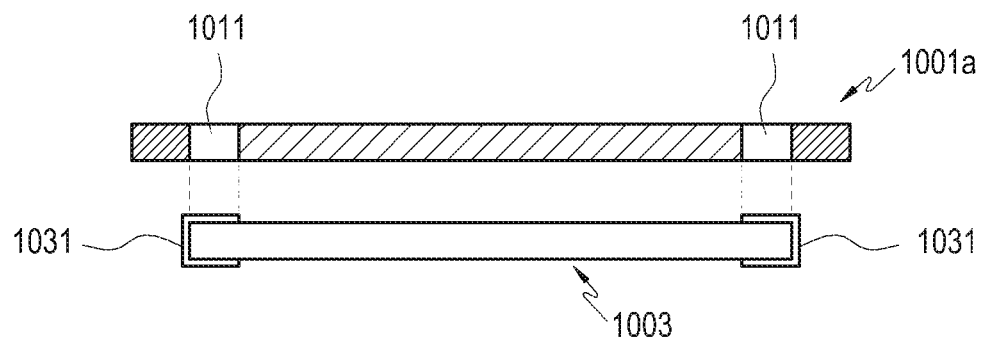
FIGS. 10, 11, 12, 13, 14, 15, and 16 illustrate views sequentially of an aspect in which a shield structure of an electronic device is formed according to various embodiments of the present disclosure.

FIG. 9 illustrates a flowchart for describing a method of manufacturing an electronic device 900 according to various embodiments of the present disclosure. FIGS. 10, 11, 12, 13, 14, 15 and 16 illustrate views sequentially of an aspect in which a shield structure of an electronic device according to various embodiments of the present disclosure is formed.

Figure 11:
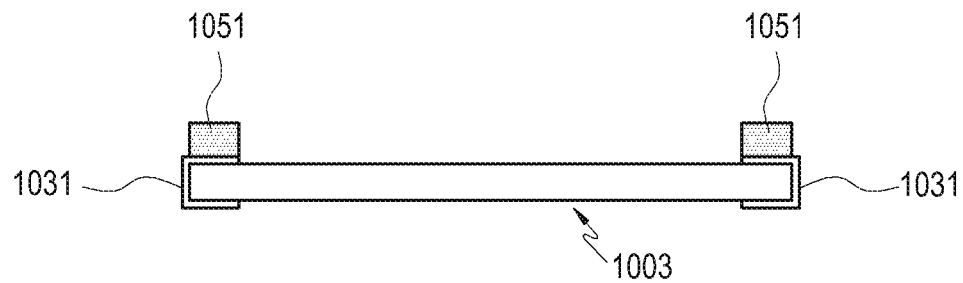
Figure 12:
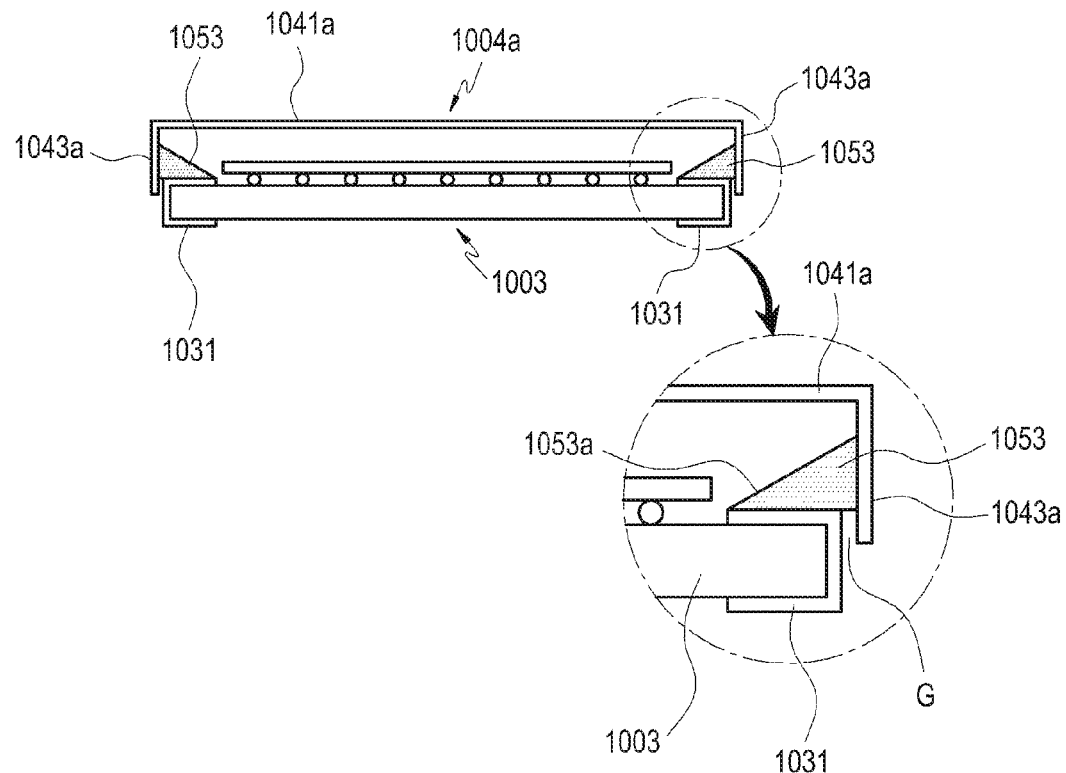
Figure 13:
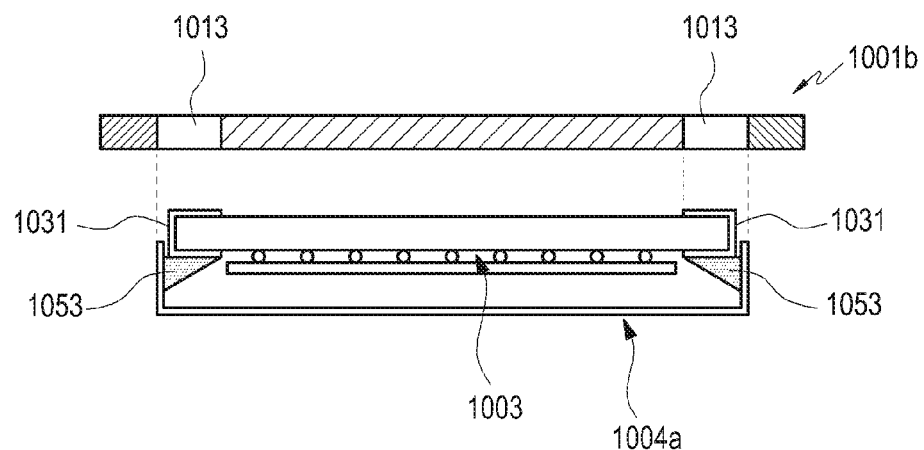
Figure 14:
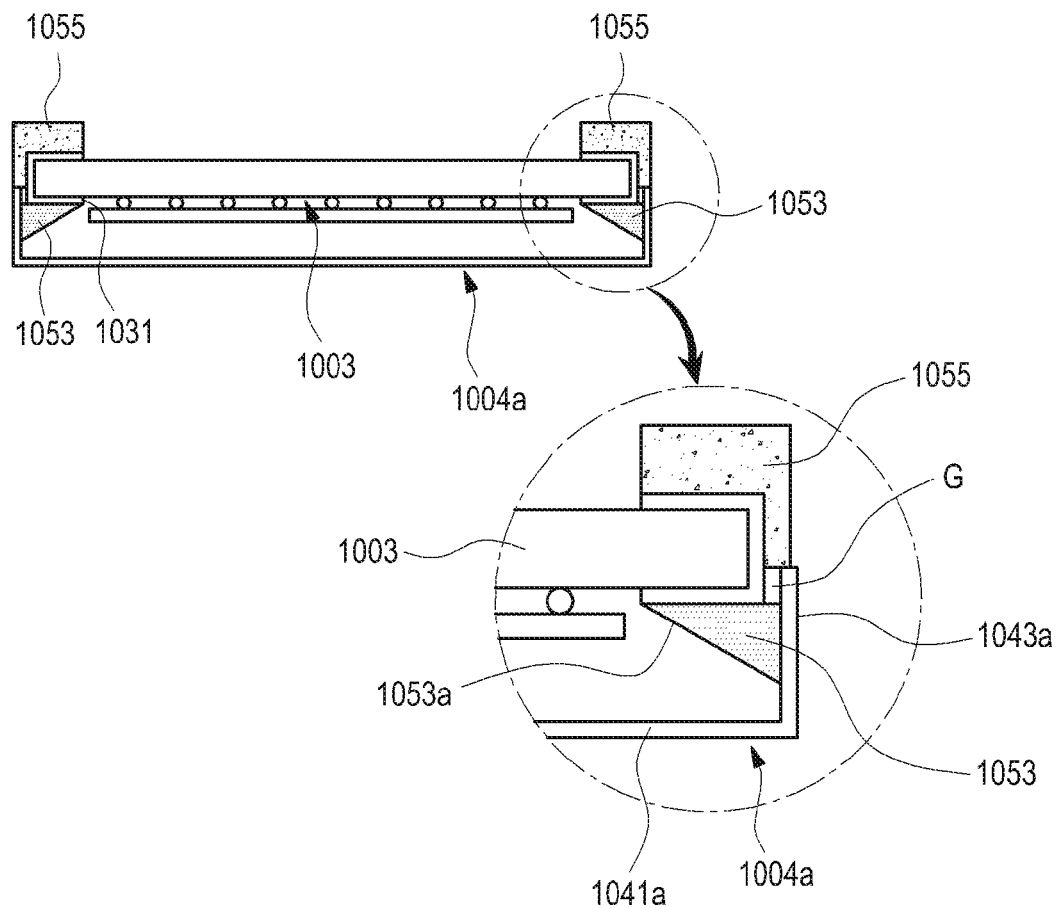
Figure 15:
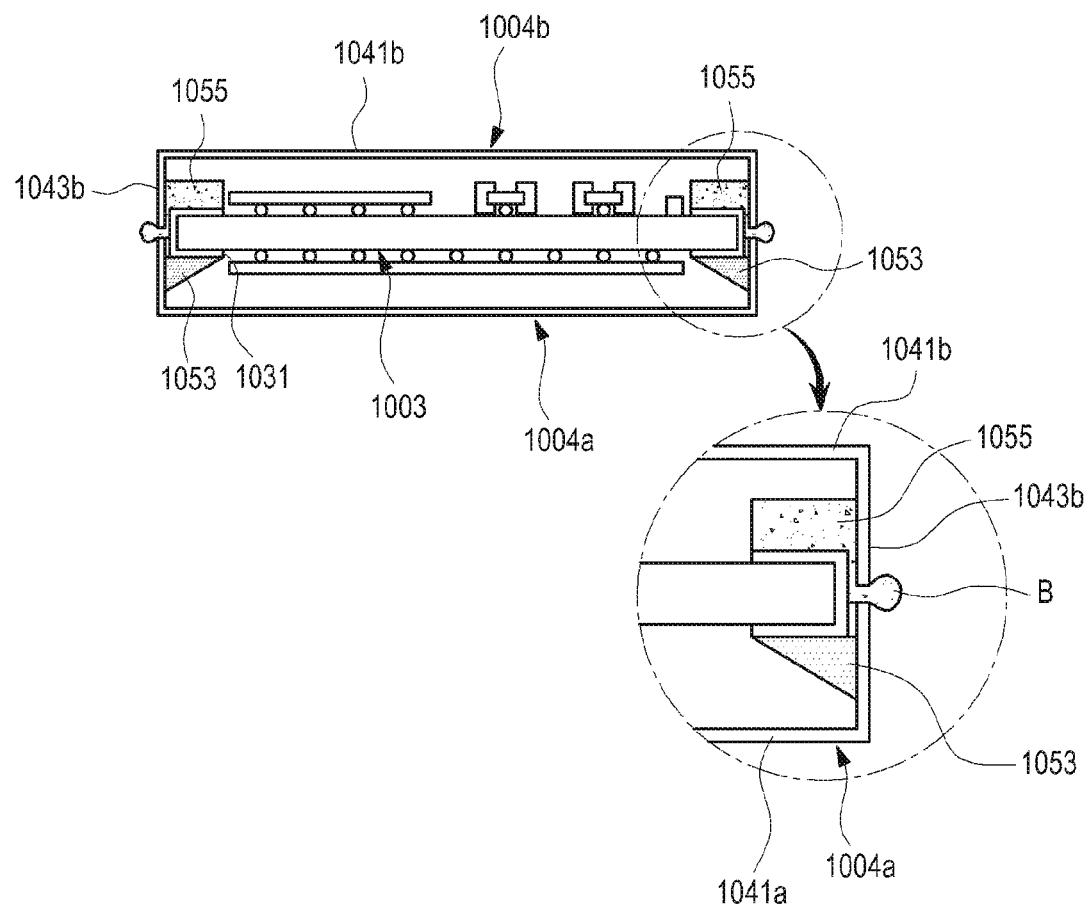
Figure 16:
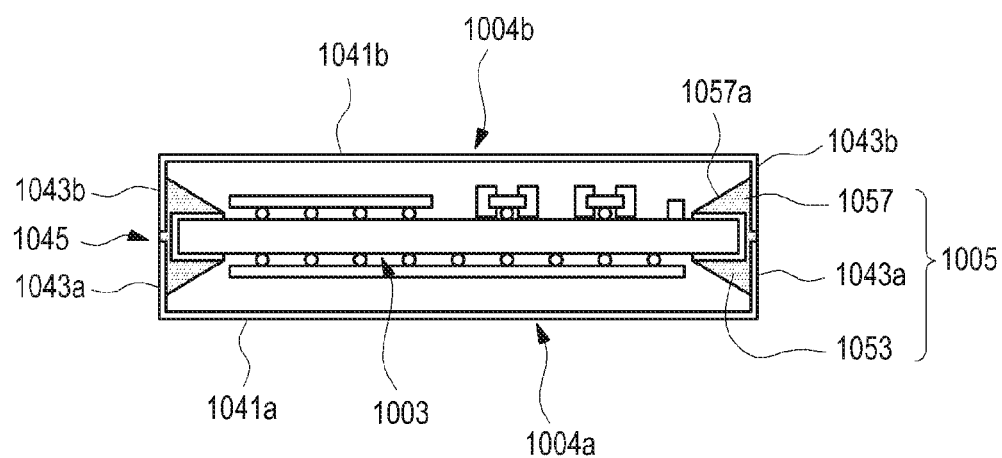

Prior to discussing the method of manufacturing an electronic device 900 according to various embodiments of the present disclosure, it is noted that FIGS. 13 and 14 illustrate a printed circuit board in a state where the top side and bottom side thereof are reversed as compared to FIG. 11 or FIG. 12. FIGS. 15 and 16 illustrate a printed circuit board in a state where the top side and the bottom side thereof are reversed. In the following detailed description or illustration of drawings, it is noted that descriptions will be made assuming that a first conductive shield member 1004a is mounted on the top side or a first board face of the printed circuit board 1003, and a second conductive shield member 1004b is mounted on the bottom side or a second board face of the printed circuit board 1003.

It is noted that while the printed circuit board 1003 according to various embodiments of the present disclosure is mounted with various electronic components, the electronic components or the like are illustrated in a simplified form in FIGS. 10 to 16 for the purpose of conciseness of the drawings and descriptions to be made with reference to the drawings. A manufacturing method to be described below may be a portion or the whole of a surface mount process, and shield structures to be described below (e.g., the first conductive shield member 1004a and the second conductive shield member 1004b) may be mounted on the printed circuit board 1003 after at least some of the above-mentioned electronic components are mounted first.

Referring to FIG. 9, the manufacturing method 900 may include forming solder pads in operation 901, applying a first solder paste in operation 902, a first reflow operation 903, applying a second solder paste in operation 904, and/or a second reflow operation 905. According to various embodiments of the present disclosure, the manufacturing method 900 may further include an operation of providing the above-mentioned printed circuit board (e.g., the printed circuit board 103 of FIG. 1).

According to various embodiments of the present disclosure, forming the solder pads in operation 901 may include a portion of, for example, the operation of providing the above-mentioned printed circuit board (e.g., the printed circuit board 303 illustrated in FIGS. 3 to 5). For example, further referring to FIG. 10, various forms of printed circuit patterns may be formed on the printed circuit board 1003, and the solder pads 1031 may be formed in the process of forming such printed circuit patterns. For example, the solder pads 1031 may be a portion of a printed circuit pattern formed on the printed circuit board 1003. In certain embodiments, the solder pad 1031 may be formed at least on a side board face of the printed circuit board 1003 (e.g., the side board face F3 of FIG. 5). In certain embodiments, one end of each solder pad 1031 may be positioned on the first board face (e.g., the top side) of the printed circuit board 1003, and the other end may be positioned on the second board face (e.g., the bottom side) of the printed circuit board 1003.

According to various embodiments of the present disclosure, applying the first solder paste in operation 902 may include an operation of applying or printing the first solder paste on a portion of each solder pad 1031. Further referring to FIGS. 10 and 11, in certain embodiments, the first solder paste 1051 may be applied to one end of the solder pad 1031 on the first board face of the printed circuit board 1003. According to various embodiments, a first mask 1001a, which is formed with one or more first openings 1011, may be used in order to apply the first solder paste 1051. For example, the first mask 1001a is placed on the printed circuit board 1003, and then the solder paste is applied onto the first mask 1001a such that the first solder paste 1051 may be applied to regions corresponding to the first openings 1011. The first openings 1011 may be positioned to correspond to the solder pads 1031 on the first board face of the printed circuit board 1003, and may have a size (e.g., width) that is smaller than one end of each of the solder pads 1031. For example, the width of each first opening 1011 (e.g., the length of the first opening 1011 in the horizontal direction in FIG. 10) may be formed in a range of 0.15 mm to 0.5 mm, and may vary depending on the size of one end of the corresponding solder pad 1031.

According to various embodiments of the present disclosure, the first reflow operation 903 may heat the printed circuit board 1003 at a predetermined temperature in a state where the first conductive shield member 1004a is placed to cover the first region of the printed circuit board 1003. The first conductive shield member 1004a may include a first flat plate 1041a that faces the first region and a first side wall 1043a that extends from the first flat plate.

According to various embodiments of the present disclosure, in the first reflow operation 903, the first solder paste 1051 may be molten to be spread between the solder pads 1031 and the first conductive shield member 1004a (e.g., the inner face of the first side wall). Further referring to FIG. 12, when cooled in this state, the molten first solder paste 1051 may be cured to form a first bonding material 1053. The first bonding material 1053 may include a first inclined face 1053a that extends from the solder pad 1031 to the inner surface of the first side wall 1043a on the first board face of the printed circuit board 1003 (e.g., the top side of the printed circuit board). The first inclined face 1053a may be formed by a surface tension acting while the molten first solder paste 1051 is cured.

In certain embodiments, after the first bonding material 1053 is formed, a certain gap G may be formed between the side board face of the printed circuit board 1003 and the first side wall 1043a. For example, the gap G formed between the solder pads 1031 on the side board face and the first side walls 1043a may be about 0.05 mm. In the second reflow operation 905 to be described later, a part of the molten second solder paste may flow into the gap G to fuse with the first bonding material 1053 to form a bonding material (e.g., the bonding material 705 of FIG. 7).

According to various embodiments of the present disclosure, applying the second solder paste in operation 904 may include an operation of applying or printing the second solder paste on another portion of each solder pad 1031. Further referring to FIGS. 13 and 14, in certain embodiments, the second solder paste 1055 may be applied to the solder pads 1031 on the second board face (e.g., the bottom side) of the printed circuit board 1003 and/or on the side board face of the printed circuit board 1003. According to various embodiments, a second mask 1001b, which is formed with one or more second openings 1013, may be used in order to apply the second solder paste 1055. For example, the second mask 1001b is placed on the printed circuit board 1003, and then the solder paste is applied onto the second mask 1001b such that the second solder paste 1055 may be applied to regions corresponding to the second openings 1013. In certain embodiments, the width of each second opening 1013 (e.g., the length of the second opening 1013 in the horizontal direction in FIG. 13) may be formed in a range of 0.2 mm to 0.5 mm, and may vary depending on the size of another portion of the corresponding solder pad 1031 (e.g., a portion intended to apply the second solder paste).

According to various embodiments of the present disclosure, the second openings 1013 may be positioned to correspond to the solder pads 1031 on the second board face of the printed circuit board 1003, and may have a size (e.g., width) that is smaller than one end of each of the solder pads 1031. For example, one end of each second opening 1013 may be positioned outside the side board face of the printed circuit board 1003. It can be seen that the second solder paste 1055 applied using the second mask 1001b is formed on another portion of the solder pads 1031 on the second board face and the side board face of the printed circuit board 1003. In certain embodiments, even in the state in which the second solder paste 1055 is applied, the gap G, which is formed between the side board face of the printed circuit board 1003 and the first side wall 1043*a*, may be maintained as an empty space.

In the specific embodiment of the present disclosure, an operation of using a mask is exemplified in the operation of applying each of the first solder paste 1051 and the second solder paste 1055, but the present disclosure does not need to be limited thereto. For example, a method to be used in the operation of applying a solder paste may be different from that of the above-described embodiment as long as it is possible to form each of the first solder paste and the second solder paste having a desired size at a desired position and in a desired region.

According to various embodiments of the present disclosure, the second reflow operation 905 may heat the printed circuit board 1003 at a predetermined temperature in a state where the second conductive shield member 1004*b* is placed to cover the second region of the printed circuit board 1003. The second conductive shield member 1004*b* may include a second flat plate 1041*b* that faces the second region and a second side wall 1043*b* that extends from the second flat plate.

Further referring to FIG. 15, the applied second solder paste 1055 may have a viscosity of certain extent. For example, when the second conductive shield member 1004*b* is disposed to face the second region of the printed circuit board 1003, a part B of the second solder paste 1055 may flow out to the outside through the gap between the first conductive shield member 1004*a* and the second conductive shield member 1004*b*. The viscosity of the second solder paste 1055 may prevent the flowing-out part B from being separated, falling down, or flowing to the outer surface of the first conductive shield member 1004*a* or the second conductive shield member 1004*b*. According to various embodiments, the second conductive shield member 1004*b* may be disposed on the printed circuit board 1003 in a state where a part of the second conductive shield member 1004*b* is matingly engaged with a part of the first conductive shield member 1004*a*.

According to various embodiments of the present disclosure, when heated at a predetermined temperature in the state where the second conductive shield member 1004*b* is disposed, the second solder paste 1055 may be molten to be spread between the solder pads 1031 and the second conductive shield member 1004*b* (e.g., the inner face of the second side wall 1043*b*). Further referring to FIG. 16, when cooled again in this state, the molten second solder paste 1055 may be cured to form a second bonding material 1057. The second bonding material 1057 may include a second inclined face 1057*a* that extends from the solder pad 1031 to the inner surface of the second side wall 1043*b* on the second board face of the printed circuit board 1003 (e.g., the bottom side of the printed circuit board). The second inclined face 1057*a* may be formed by a surface tension acting while the molten second solder paste 1055 is cured.

In certain embodiments, the molten second solder paste 1055 may flow into a space (e.g., the gap G of FIG. 14), which is formed between the side board face of the printed circuit board 1003 and the inner face of the first side wall 1043*a*, due to a capillary phenomenon. In the second reflow in operation 905, the first bonding material 1053 may also be heated to be partially molten, and may fuse with the second solder paste 1055 within the gap G. For example, in the second reflow operation 905, the second bonding material 1057 is formed in a state where it fuses with the first bonding material 1053, and the first bonding material 1053 and the second bonding material 1057 may be combined with each other so as to form one bonding material 1005.

According to various embodiments, a part of the bonding material 1005 may be exposed to the outside of the first conductive shield member 1004*a* or the second conductive shield member 1004*b* through the gap between the first side wall 1043*a* and the second side wall 1043*b*. For example, the first side wall 1043*a* and the second side wall 1043*b* may be disposed to be matingly engaged with each other on the side board face of the printed circuit board 1003 and/or in the vicinity of the side board face of the printed circuit board 1003, and a part of the bonding material 1005 may be exposed to the outside through the boundary between the first side wall 1043*a* and the second side wall 1043*b* (e.g., the zigzag line 645 of FIG. 6). In certain embodiments, the bonding material 1005 may seal the boundary between the first side wall 1043*a* and the second side wall 1043*b*, thereby improving the shield performance of the shield structure including the first conductive shield member 1004*a* and the second conductive shield member 1004*b*.

In certain embodiments, the bonding material 1005 may form a fillet including each of the first inclined face 1053*a* and the second inclined face 1057*a* so as to fix a part of the first conductive shield member 1004*a* (e.g., the first side wall 1043*a*) to the first board face of the printed circuit board 1003 and a part of the second conductive shield member 1004*b* (e.g., the second side wall 1043*b*) to the second board face of the printed circuit board 1003. In addition, or alternatively, the bonding material 1005 may fix a part of the first conductive shield member 1004*a* (e.g., the first side wall 1043*a*) to the side board face of the printed circuit board 1003 and a part of the second conductive shield member 1004*b* (e.g., the second side wall 1043*b*) to the side board face of the printed circuit board 1003.

According to various embodiments, the first conductive shield member 1004*a* or the second conductive shield member 1004*b* may be both of the first or second board face and the side board face of the printed circuit board 1003 when being mounted on, and fixed to, the printed circuit board 1003. For example, the first conductive shield member 1004*a* or the second conductive shield member 1004*b* may be rigidly mounted on, and fixed to, the printed circuit board 1003.

Figure 17:
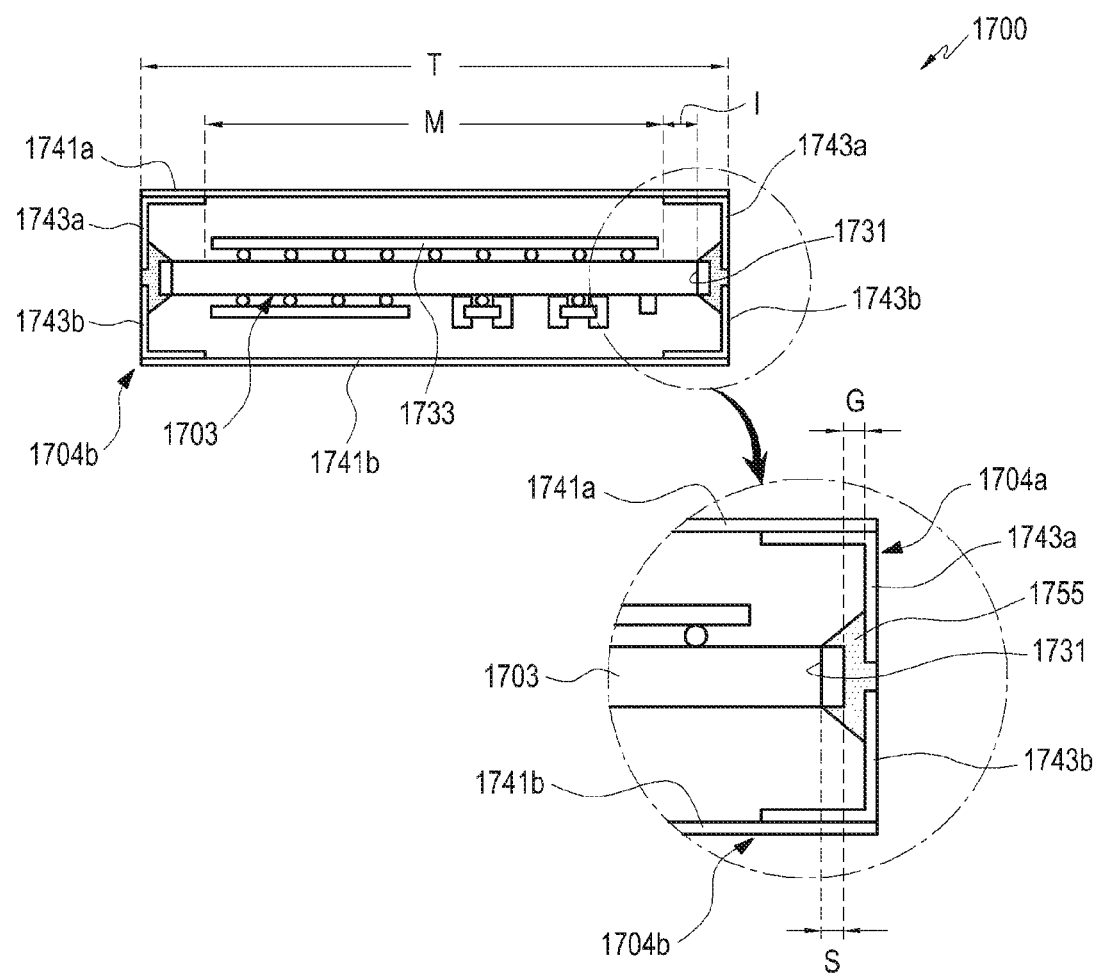
FIG. 17 illustrates a view for describing an electronic device manufactured using the manufacturing method according to various embodiments of the present disclosure and/or the components of the electronic device.

FIG. 17 illustrates a view for describing an electronic device manufactured using the manufacturing method according to various embodiments of the present disclosure and/or the components of the electronic device.

According to various embodiments of the present disclosure, an electronic device (hereinafter, referred to as an "electronic device 1700") and/or components of the electronic device may include a first conductive shield member 1704*a* mounted to face a first board face (e.g., the first board face F1 of FIG. 3) of printed circuit board 1703 (e.g., the printed circuit board 303 of FIGS. 3 to 5), and a second conductive shield member 1704*b* mounted to face a second board face (e.g., the second board face F2 of FIG. 3) of the printed circuit board 1703. In certain embodiments, the entire width T of the electronic device 1700 may be in the range of 10 mm to 20 mm, for example, 16 mm. The printed circuit board 1703 may include at least one electronic component 1733 (e.g., an integrated circuit chip) mounted on the first board face and/or the second board face. In the present embodiment, an example is disclosed in which the electronic component 1733 is mounted on the first board face of the printed circuit board 1703, but the present disclosure does not need to be limited thereto. In certain embodiments, the electronic component 1733 may be an integrated circuit chip including an application processor (e.g., the AP 21 of FIG. 2). In the regions in which the first board face and/or the second board face are provided in the printed circuit board 1703, the region in which the electronic component 1733 is mounted may have a width M of about 9 mm to 19 mm, e.g., 15 mm.

According to various embodiments of the present disclosure, a side face of the printed circuit board 1703 (e.g., the side board face (e.g., the board side face F3 of FIG. 5) that interconnects the first board face and the second board face) may be formed with a solder pad 1731. The distance I from the region where the electronic component 1733 is mounted, to the solder pad 1731, may be about 0.1 mm to 0.2 mm, for example, 0.15 mm. As described above, the solder pad 1731 provides means for mounting the first conductive shield member 1704*a* and/or the second conductive shield member 1704*b* to the printed circuit board 1703, and may be formed to be spaced apart, by a predetermined distance, from the region where the electronic component 1733 is mounted.

According to certain embodiments, the first conductive shield member 1704*a* and/or the second conductive shield member 1704*b* may include a first side wall 1743*a* and/or a second side wall 1743*b*. According to various embodiments, each of the first side wall 1743*a* and the second side wall 1743*b* may take the form of a frame, and shield films 1741*a* and 1741*b* may be attached to the first side wall 1743*a* and the second side wall 1743*b*, respectively, so as to complete the first conductive shield member 1704*a* and the second conductive shield member 1704*b*, respectively. In certain embodiments, the first side wall 1743*a* and/or the second side wall 1743*b* may be manufactured through sheet metal working of a metal plate having a thickness in the range of 0.1 mm to 0.2 mm, for example, 0.15 mm. In certain embodiments, the shield films 1741*a* and 1741*b* may be manufactured by processing an electromagnetic shield film having a thickness of 0.03 mm to 0.07 mm, for example, 0.05 mm. For example, the first flat plate (e.g., the first flat plate 1041*a* of FIG. 15) and/or the second flat plate (the second flat plate 1041*b* of FIG. 15) of the above-described embodiment may be replaced by the shield films 1741*a* and 1741*b*.

According to various embodiments, the solder pad 1731 may be formed on the side face of the printed circuit board 1703 in the process of forming a printed circuit pattern on the printed circuit board 1703, and may be formed to have a thickness of about 0.03 mm to 0.07 mm, for example, 0.05 mm by depositing or plating a conductive metal, such as gold, silver, or copper. According to various embodiments, a part of the solder pad 1731 may be positioned on the first board face and/or the second board face of the printed circuit board 1703.

In certain embodiments, the first conductive shield member 1704*a* and/or the second conductive shield member 1704*b* may be mounted on the printed circuit board 1703 via a bonding material 1755. For example, a portion of the first side wall 1743*a* and/or a portion of the second side wall 1743*b* (e.g., a portion of the inner surface of the first side wall 1743*a* and/or a portion of the inner face of the second side wall 1743*b*) may each be positioned to face the side face of the printed circuit board 1703 (e.g., the solder pad 1731), and the bonding material 1755 may bond a portion of the first side wall 1743*a* and/or a portion of the second side wall 1743*b* to the solder pad 1731. According to various embodiments, the bonding material 1755 may include a solder paste and/or a solder, and may be applied onto the solder pad 1731 in a process of mounting the electronic component 1733 or the like on the printed circuit board 1703 (e.g., a surface mounting process).

According to various embodiments, when heating is performed in the state where the first conductive shield member 1704*a* and/or the second conductive shield member 1704*b* are disposed after the solder paste is applied to the solder pad 1731, the solder paste applied to the solder pad 1731 may be molten. The molten solder paste may cured between the solder pad 1731 and the first side wall 1743*a* and/or between the solder pad 1731 and the second side wall 1743*b* so as to fix the first conductive shield member 1704*a* and/or the second conductive shield member 1704*b* to the printed circuit board 1703. In certain embodiments, after the solder paste is cured, the bonding material 1755 may have a thickness in the range of about 0.03 mm to 0.07 mm, for example, 0.05 mm.

As described above, an electronic device, according to various embodiments of the present disclosure, may include: a housing including a first face that faces a first direction; a printed circuit board including first and second board faces that are substantially parallel to the first face, and a side board face that faces a second direction that is different from the first direction, the printed circuit board being disposed within the housing; a first electronic component disposed in a first region of the first board face; a second electronic component disposed in a second region of the second board face that at least partially overlaps with the first region when viewed from above the first board face or the second board face; a first conductive shield member including a first side wall formed to face the second direction so as to extend at least a portion of the side board face, the first conductive shield member covering the first region; a second conductive shield member including a second side wall formed to face the second direction so as to extend at least a portion of the side board face, the second conductive shield member covering the second region; and at least one bonding material formed between the first side wall and at least a portion of the side board face and/or between the second side wall and at least a portion of the side board face. The second side wall and the first side wall may be engaged with each other in at least a portion of the side board face or adjacent to at least a portion of the side board face.

According to various embodiments, the at least one bonding material may include solder.

According to various embodiments, the first side wall may include an edge having a first repeated pattern, and the second side wall may include an edge having a second repeated pattern that is engaged with the first repeated pattern.

According to various embodiments, portions of the first side wall and portions of the second side wall may be alternately arranged along a longitudinal direction of the side board face.

According to various embodiments, a zigzag line may be formed between the first side wall and the second side wall on the side board face.

According to various embodiments, the bonding material may be positioned between a region where the zigzag line is formed and the side board face.

According to various embodiments, the first side wall and the second side wall may be disposed in a state where faces thereof, which face the side board face, are positioned on a common plane.

According to various embodiments, a portion of the bonding material may be exposed outside of the first conductive shield member or the second conductive shield member through a gap between the first side wall and the second side wall.

According to various embodiments, the above-described electronic device may further include a solder pad that extends from the side board face such that one end of the solder pad is positioned on the first board face, and the bonding material may include a first inclined face extending from the solder pad to an inner face of the first side wall on the first board face.

According to various embodiments, another end of the solder pad may be positioned on the second board face, and the bonding material may include a second inclined face extending from the solder pad to an inner face of the second side wall on the second board face.

According to various embodiments, the first electronic component or the second electronic component may include an integrated circuit chip that is equipped with at least one of an application processor, a radio frequency module, an audio module, and a power management module.

According to various embodiments of the present disclosure, a method of manufacturing an electronic device may include: an operation of providing a printed circuit board that includes a first board face, a second board face that is parallel to the first board face, and a side board face that interconnects the first and second board faces; an operation of forming a solder pad at least on the side board face; an operation of applying a first solder paste on a portion of the solder pad; performing a first reflow process to mount a first conductive shield member, which includes a first side wall extending to at least a portion of the side board face, on the printed circuit board to cover a first region in the first board face by using the first solder paste; an operation of applying a second solder paste on another portion of the solder pad; and performing a second reflow process to mount a second conductive shield member, which includes a second side wall extending to at least a portion of the side board face, on the printed circuit board to cover a second region in the second board face by using the second solder paste.

According to various embodiments, one end of the solder pad may be positioned on the first board face, and the operation of applying the first solder paste may include an operation of applying the first solder paste at the one end of the solder pad on the first board face.

According to various embodiments, the operation of performing the first reflow process may include an operation of forming, by using the first solder paste, a first bonding material, which includes an inclined face extending from an edge of the solder pad on the first board face to an inner face of the first side wall.

According to various embodiments, another end of the solder pad may be positioned on the second board face, and the operation of applying the second solder paste includes an operation of applying the second solder paste at another end of the solder pad on the second board face or the side board face.

According to various embodiments, the operation of performing the second reflow process may include an operation of forming, by using the second solder paste, a second bonding material, which includes an inclined face extending from an edge of the solder pad on the second board face to an inner face of the second side wall.

According to various embodiments, the operation of performing the second reflow process includes an operation of forming a second bonding material by causing a portion of the second solder paste to flow into a gap between the side board face and the inner face of the first side wall.

According to various embodiments, the operation of applying the first solder paste and/or the applying the second solder paste may include: an operation of placing a mask having at least one opening formed therein on the printed circuit board; and an operation of applying a solder paste onto the mask.

According to various embodiments, the method may further include an operation of mounting each of the first and second conductive shield members in such a manner in which the second side wall and the first side wall are matingly engaged with each other on at least a portion of the side board face or adjacent to at least a portion of the side board face.

According to various embodiments, the operation of mounting each of the first and second conductive shield members on the printed circuit board may include an operation of mounting the first and second conductive shield members on the printed circuit board in such a manner in which a zigzag line is formed between the first and second side walls on the side board face.

According to various embodiments, the operation of mounting each of the first and second conductive shield members on the printed circuit board may include an operation of forming a bonding material between a region in which the zigzag line is formed and the side board face through the first reflow process or the second reflow process by using the first solder paste or the second solder paste.

According to various embodiments, the method may further include an operation of forming the bonding material to be at least partially exposed to outside of the first conductive shield member or the second conductive shield member through a gap between the first side wall and the second side wall.

An electronic device according to various embodiments of the present disclosure may include a component formed by the manufacturing method as described above.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An electronic device comprising:
   a housing including a first face configured to face a first direction;
   a printed circuit board including first and second board faces that are substantially parallel to the first face, and a side board face configured to face a second direction different from the first direction, the printed circuit board disposed within the housing;
   a first electronic component disposed in a first region of the first board face;
   a second electronic component disposed in a second region of the second board face that the second region at least partially overlaps with the first region when viewed from above the first board face or the second board face;
   a first conductive shield member including a first side wall formed to face the second direction to extend over at least a portion of the side board face, the first conductive shield member covering the first region;
   a second conductive shield member including a second side wall formed to face the second direction so as to extend over at least a portion of the side board face, the second conductive shield member covering the second region; and at least one bonding material formed between the first side wall and at least a portion of the side board face or between the second side wall and at least a portion of the side board face,
wherein the second side wall and the first side wall are matingly engaged with each other in at least a portion of the side board face or adjacent to at least the portion of the side board face.

2. The electronic device of claim 1, wherein the at least one bonding material includes a solder.

3. The electronic device of claim 1, wherein the first side wall includes an edge comprising a first repeated pattern, and the second side wall includes an edge comprising a second repeated pattern engaged with the first repeated pattern.

4. The electronic device of claim 1, wherein portions of the first side wall and portions of the second side wall are alternately arranged along a longitudinal direction of the side board face.

5. The electronic device of claim 1, wherein a zigzag line is formed between the first side wall and the second side wall on the side board face.

6. The electronic device of claim 5, wherein the at least one bonding material is positioned between a region where the zigzag line is formed and the side board face.

7. The electronic device of claim 1, wherein the first side wall and the second side wall are disposed in a state where each includes a face that faces the side board face and are positioned on a common plane.

8. The electronic device of claim 1, wherein a portion of the at least one bonding material is exposed outside of the first conductive shield member or the second conductive shield member through a gap between the first side wall and the second side wall.

9. The electronic device of claim 1, further comprising:
a solder pad configured to extend from the side board face in a manner that one end of the solder pad is positioned on the first board face,
wherein the at least one bonding material includes a first inclined face extending from the solder pad to an inner face of the first side wall on the first board face.

10. The electronic device of claim 9, wherein another end of the solder pad is positioned on the second board face, and
the at least one bonding material includes a second inclined face extending from the solder pad to an inner face of the second side wall on the second board face.

11. The electronic device of claim 1, wherein the first electronic component or the second electronic component includes an integrated circuit chip equipped with at least one of an application processor, a radio frequency module, an audio module, and a power management module.

12. A method of manufacturing an electronic device, the method comprising:
providing a printed circuit board including a first board face, a second board face parallel to the first board face, and a side board face interconnecting the first and second board faces;
forming a solder pad at least on the side board face;
applying a first solder paste on a portion of the solder pad;
performing a first reflow process to mount a first conductive shield member, the first conductive shield member includes a first side wall extending to at least a portion of the side board face on the printed circuit board to cover a first region in the first board face by using the first solder paste;
applying a second solder paste on another portion of the solder pad; and
performing a second reflow process to mount a second conductive shield member, the second conductive shield member
includes a second side wall extending to at least a portion of the side board face on the printed circuit board to cover a second region in the second board face by using the second solder paste.

13. The method of claim 12, wherein:
one end of the solder pad is positioned on the first board face, and
applying the first solder paste includes applying the first solder paste at the one end of the solder pad on the first board face.

14. The method of claim 13, wherein performing the first reflow process includes forming, by using the first solder paste, a first bonding material, which includes an inclined face extending from an edge of the solder pad on the first board face to an inner face of the first side wall.

15. The method of claim 12, wherein:
another end of the solder pad is positioned on the second board face, and
applying the second solder paste includes applying the second solder paste at another end of the solder pad on the second board face or the side board face.

16. The method of claim 15, wherein performing the second reflow process includes forming, by using the second solder paste, a second bonding material, which includes an inclined face extending from an edge of the solder pad on the second board face to an inner face of the second side wall.

17. The method of claim 15, wherein performing the second reflow process includes forming a second bonding material by causing a portion of the second solder paste to flow into a gap between the side board face and an inner face of the first side wall.

18. The method of claim 12, wherein applying the first solder paste or the applying the second solder paste include:
placing a mask comprising at least one opening formed therein on the printed circuit board; and
applying a solder paste onto the mask.

19. The method of claim 12, further comprising:
mounting each of the first and second conductive shield members in such a manner in which the second side wall and the first side wall are matingly engaged with each other on at least a portion of the side board face or adjacent to at least a portion of the side board face.

20. The method of claim 19, wherein mounting each of the first and second conductive shield members on the printed circuit board includes mounting the first and second conductive shield members on the printed circuit board in such a manner in which a zigzag line is formed between the first and second side walls on the side board face.

21. The method of claim 19, wherein mounting each of the first and second conductive shield members on the printed circuit board includes forming a bonding material between a region in which a zigzag line is formed and the side board face through the first reflow process or the second reflow process by using the first solder paste or the second solder paste.

22. The method of claim 21, further comprising:
forming the bonding material to be at least partially exposed to an outside of the first conductive shield member or the second conductive shield member through a gap between the first side wall and the second side wall.

23. An electronic device comprising:
a component formed by:

providing a printed circuit board including a first board face, a second board face parallel to the first board face, and a side board face interconnecting the first and second board faces;

forming a solder pad at least on the side board face;

applying a first solder paste on a portion of the solder pad;

performing a first reflow process to mount a first conductive shield member, the first conductive shield member includes a first side wall extending to at least a portion of the side board face on the printed circuit board to cover a first region in the first board face by using the first solder paste;

applying a second solder paste on another portion of the solder pad; and performing a second reflow process to mount a second conductive shield member, the second conductive shield member includes a second side wall extending to at least a portion of the side board face, on the printed circuit board to cover a second region in the second board face by using the second solder paste.

* * * * *